(12) United States Patent  
Schleuning et al.

(10) Patent No.: US 7,686,224 B2
(45) Date of Patent: Mar. 30, 2010

(54) LENSED DUAL DIODE-LASER BAR PACKAGE

(75) Inventors: David Schleuning, Oakland, CA (US); Paul Lovato, Sunnyvale, CA (US); Mike Griffin, San Jose, CA (US); John McNulty, Oakland, CA (US)

(73) Assignee: Coherent, Inc., Santa Clara, CA (US)

( * ) Notice: Subject to any disclaimer, the term of this patent is extended or adjusted under 35 U.S.C. 154(b) by 882 days.

(21) Appl. No.: 11/512,590

(22) Filed: Aug. 30, 2006

(65) Prior Publication Data

US 2008/0054076 A1   Mar. 6, 2008

(51) Int. Cl.
 G02B 5/08 (2006.01)
 G02B 26/00 (2006.01)
 G06K 7/10 (2006.01)
 G06K 7/14 (2006.01)

(52) U.S. Cl. ............. 235/462.35; 235/454; 235/462.43; 359/811; 359/819; 359/820; 359/821; 359/822; 359/823; 359/827

(58) Field of Classification Search ............ 235/462.35, 235/462.43, 454; 359/811–830
See application file for complete search history.

(56) References Cited

U.S. PATENT DOCUMENTS

| 4,531,702 | A  | * | 7/1985  | Plummer ...................... 249/64 |
| 4,636,925 | A  | * | 1/1987  | Kristofek .................... 362/277 |
| 6,166,759 | A  |   | 12/2000 | Blanding ..................... 347/242 |
| 6,538,312 | B1 |   | 3/2003  | Peterson et al. ............. 257/680 |
| 6,647,035 | B1 |   | 11/2003 | Freitas et al. ................. 372/36 |
| 6,757,308 | B1 |   | 6/2004  | Eldring et al. ................ 372/36 |
| 2006/0017127 | A1 | * | 1/2006 | Vigier-Blanc ............... 257/432 |

* cited by examiner

Primary Examiner—Thien M. Le
Assistant Examiner—Tuyen K Vo
(74) Attorney, Agent, or Firm—Morrison & Foerster LLP

(57) ABSTRACT

A diode-laser bar package includes two diode-laser bars mounted on a heat sink with slow-axes of the diode-laser bars aligned. Three spaced apart mounting bosses extend from the front of the heat sink. The package includes two cylindrical lens assemblies. Each lens assembly has an elongated cylindrical lens bonded to a rectangular mounting block. The cylindrical lenses are aligned with the diode-laser bars. Lateral faces of the mounting block are epoxy-bonded to lateral faces of the mounting bosses. Bonding is effected by injecting liquid epoxy between the faces to be bonded though holes extending through the mounting blocks from front to the lateral faces of the mounting blocks. The liquid epoxy is then cured to complete the attachment.

19 Claims, 4 Drawing Sheets

LENSED DUAL DIODE-LASER BAR PACKAGE

TECHNICAL FIELD OF THE INVENTION

The present invention relates in general to packaging of diode-laser bars. The invention related in particular to method of mounting a cylindrical fast-axis collimating lens in a diode-laser bar package.

DISCUSSION OF BACKGROUND ART

A diode-laser (edge-emitting semiconductor laser) bar usually includes a plurality of individual diode-lasers (emitters) distributed along a "bar" comprising a plurality of semiconductor layers epitaxially grown on an electrically conductive semiconductor substrate. Such a bar usually has a length of about 10 millimeters (mm), a width of between about 1 mm and 1.5 mm, and a thickness of between about 100 micrometers ($\mu m$) and 300 $\mu m$. The emitters (diode-lasers) of the bar are formed in the epitaxial layers.

In a diode-laser bar configured to deliver near infrared radiation with a power of about 1 Watt (W) per emitter or more, the width of the emitters is typically between about 50 $\mu m$ and 200 $\mu m$. Usually, the wider the emitter the higher the power output of an individual emitter. The number of emitters in a bar is determined by the length of the bar, the width of the emitters, and the spacing therebetween. Twenty emitters per bar is not an uncommon number of emitters per bar.

The emitters are aligned in the bar along an axis generally designated the slow-axis of the bar. This axis is so named because the beam emitted by an emitter has a relatively low divergence in this axis, for example about 10°. An axis perpendicular to the slow axis is designated the fast axis, as in this axis the emitted beams have a divergence of about 35° or even greater. In most applications of a diode laser bar it is necessary to collimate the emitted beams in the fast-axis. In a diode-laser bar package this is typically done by aligning a positive cylindrical lens, having a length about equal to the length of the bar, with the slow axis of the emitters at about a focal length of the lens, usually less than 1 millimeter (mm) from the emitters. A diode-laser bar package usually includes a heat-sink to which the bar is thermally connected, the fast-axis collimating lens fixed to the package in some way, and electrical arrangements for connecting electrical current to the emitters of the diode-laser bar. All of these components are assembled with an assortment of clamps, solders, and adhesives.

It is essentially impossible to have all of these components, clamps, solders, adhesives matched for thermal expansion coefficient. This is particularly true of the cylindrical lens and mounting arrangements thereof. As a result of this, the cylindrical lens in most commercial diode-laser bar packages is very vulnerable to misalignment due to thermal cycling. A few micrometers misalignment of the cylindrical lens in the fast axis can cause problematic changes in beam pointing. Most commercially available diode-laser bar packages will experience fatal lens misalignment in less than 50 thermal cycles between −55° C. and 85° C. Improving thermal-cycle lifetime of the cylindrical lens mounting in diode-laser bar packages presents a continuing challenge to manufacturers of such packages.

SUMMARY OF THE INVENTION

In one aspect of the present invention apparatus in accordance with the invention comprises a heat-sink having an elongated diode-laser bar in thermal communication therewith. The diode-laser bar has a slow-axis in the length direction of the diode-laser bar, a fast axis perpendicular to the slow-axis, and an emitting-axis perpendicular to the slow-axis and the fast axis. Two bosses extend from a front face of the heat-sink. Each of the bosses has a lateral face transverse to the slow axis of the diode-laser. The lateral faces of the bosses are spaced apart, facing each other in a direction parallel to the slow axis of the diode-laser bar. A lens assembly includes a cylindrical lens bonded to an elongated mounting slab. The mounting slab has first and second lateral faces at each end thereof. The lens assembly is positioned on the heat sink with the length of the cylindrical lens aligned with the slow axis of the diode-laser bar and with the lateral faces of the mounting slab of the lens assembly attached by an adhesive to corresponding ones of the lateral faces of the mounting bosses.

In a preferred embodiment of the invention, each of the mounting bosses has a hole extending therethrough from a front face thereof to the lateral face thereof. The length of the mounting slab of the lens assembly and the spacing between the lateral faces of the mounting bosses of the heat sink are selected such that there is a relatively narrow gap between each lateral face of the mounting slab and the corresponding lateral face of the mounting boss. The adhesive is injected in liquid form into the gaps via the corresponding holes in the mounting bosses and cured to harden the adhesive and complete attachment of the lens assembly to the diode-laser package.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
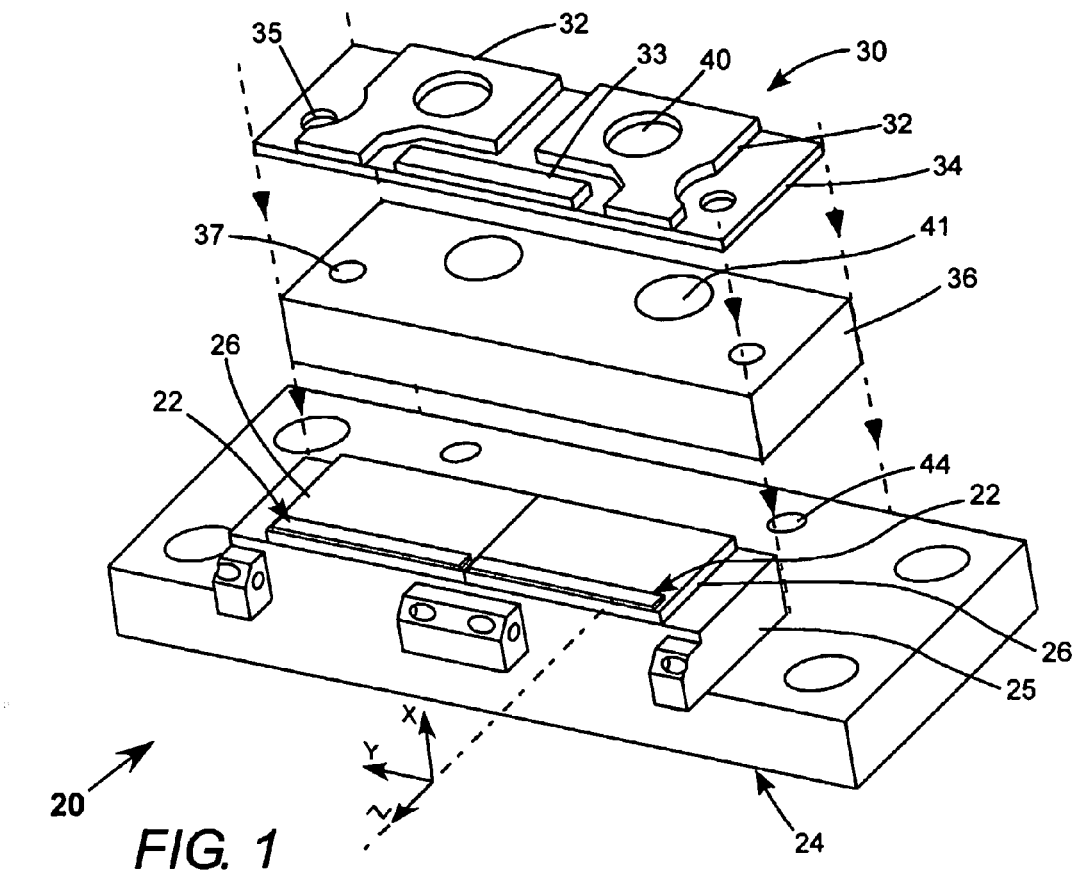
FIG. 1 is an exploded three-dimensional view schematically illustrating one preferred embodiment of a diode-laser bar package in accordance with the present invention before a fast-axis collimating lens is added, the package includes two slow-axis-aligned diode-laser bars mounted on a heat-sink via a thermally conductive dielectric sub-mount, and a high current interface unit arranged to be supported on the heat-sink via a block of insulating material.
Figure 2:
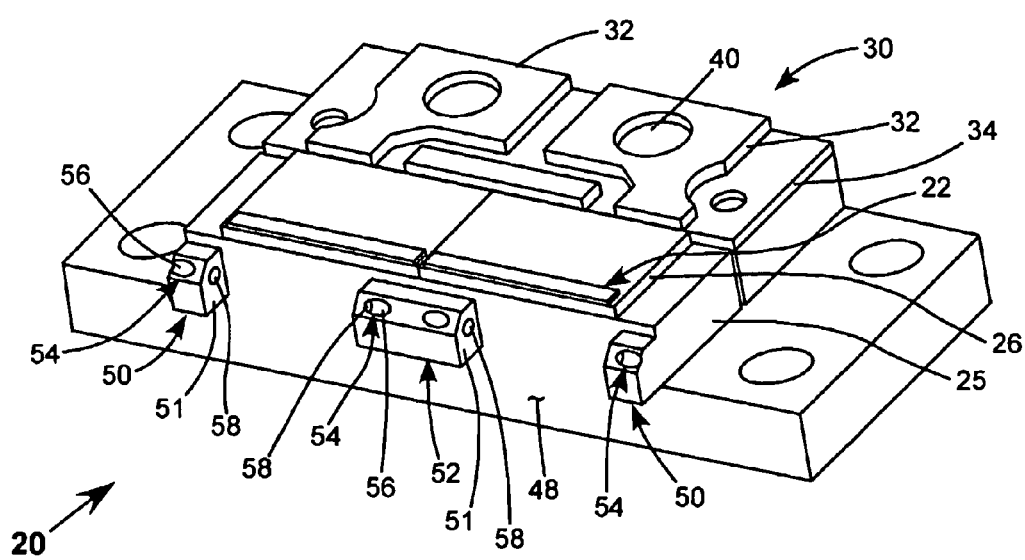
FIG. 2 is a three-dimensional view schematically illustrating the package of FIG. 1 in assembled form.

Referring now to the drawings, wherein like components are designated by like reference numerals, FIG. 1, and FIG. 2 schematically illustrate a preferred embodiment 20 of a diode-laser bar package in accordance with the present invention before a cylindrical lens assembly is added to the package. FIG. 1 is an exploded view depicting certain separate components. FIG. 2 depicts the components in assembled form. Package 20 includes two diode-laser bars 22, each thereof soldered to a thermally conductive dielectric sub-mount 26. Sub-mounts 26 are soldered to a raised portion 25 of a metal heat-sink 24. The heat sink is preferably made from copper (Cu) or a copper-tungsten (Cu—W) alloy. Sub-mount 26 is preferably made from beryllium oxide. This selection of materials, however, should not be considered as limiting the present invention. The front edge of the diode-laser bar (not numerically designated) preferably overhangs the sub-mount by a few microns and is parallel to front face 48 of heat-sink 24.

A high current interface unit 30 includes power-supply connection pads 32 and bridge pad 33 electrically isolated from each other. The pads are laminated on a plate 34 of a dielectric (fiberglass epoxy) material. Pads 32 are for connecting assembly to 22 to a high current power supply, and bridge pad 33 facilitates series connection of one diode-laser bar with the other. Intermediate electrode strips and wire bonds (not shown) connect the diode-laser bars to connection pads 32 and bridge pad 31. Methods of connecting diode-laser bars via intermediate strips and wire bonds are well known to those skilled in the art and a description thereof is not necessary for understanding principles of the present invention.

High current interface unit 30 is assembled on to a rectangular block 36 of a dielectric material by screws (not shown) extending through apertures 35 in plate 34 into threaded holes 37 in block 36. Block 36 may be formed from glass. Block 36 is attached to heat sink 24 by screws (not shown) extending upwards through apertures 44 in heat sink 24 into threaded apertures (not shown) in block 36. Electrical leads (not shown) from a power supply (not shown) are clamped to pads 32 via screws (not shown) extending downward through apertures 40 in high current interface unit 30 into threaded holes 41 in glass block 36. The orientations of the fast-axis, slow-axis and propagation-axis of diode-laser bar 22 are indicated in FIG. 1 as the X-axis, Y-axis, and Z-axis respectively Referring in particular to FIG. 2, extending from front face 48 of heat sink 24 are two end-bosses 50 and a central boss 52. In a preferred arrangement these bosses are integral parts heat sink 24, i.e., the heat sink, including raised portion 25 thereof and bosses 50 and 52, is preferably machined from a single metal block. The bosses include faces 51 transverse to the slow-axis of the diode-laser bar, and preferably perpendicular to the slow-axis of the diode-laser bar as depicted in FIGS. 1 and 2. These faces are provided for lens assembly attachment. Bosses 50 each have a hole 54 extending therethrough from a front surface thereof (here, sloping surface 55) to the transverse face 51 thereof. Central boss 52 includes two such holes. An aperture 56 in face 55 functions as an entrance aperture of the hole and an aperture 58 in face 51 functions as an exit aperture of the hole. Depending on the dimensions of the structure, the entrance aperture could be located on the side face or the top face of the boss.

Figure 3:
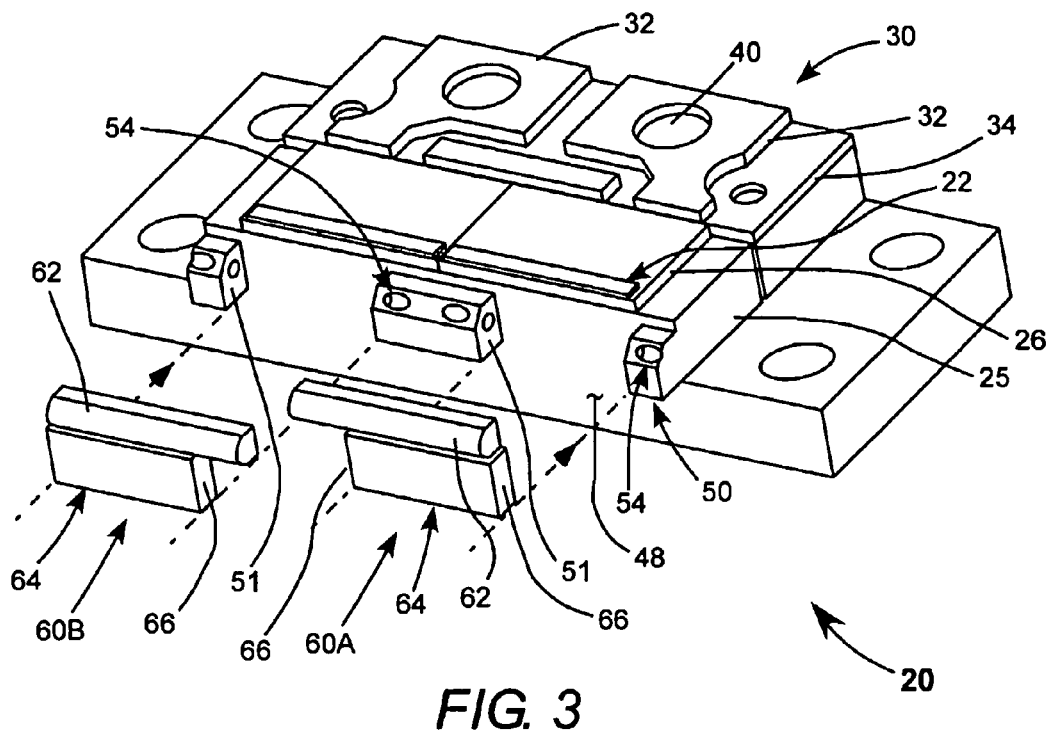
FIG. 3 is an exploded view schematically illustrating the package of FIG. 2 and two fast-axis-collimating lens assemblies, each thereof including an elongated cylindrical fast-axis collimating lens bonded to a thermal-coefficient-of-expansion-matched mounting and stiffening tab, and each thereof attachable via this tab to two bosses integral with and extending from a front-face of the heat-sink.
Figure 4:
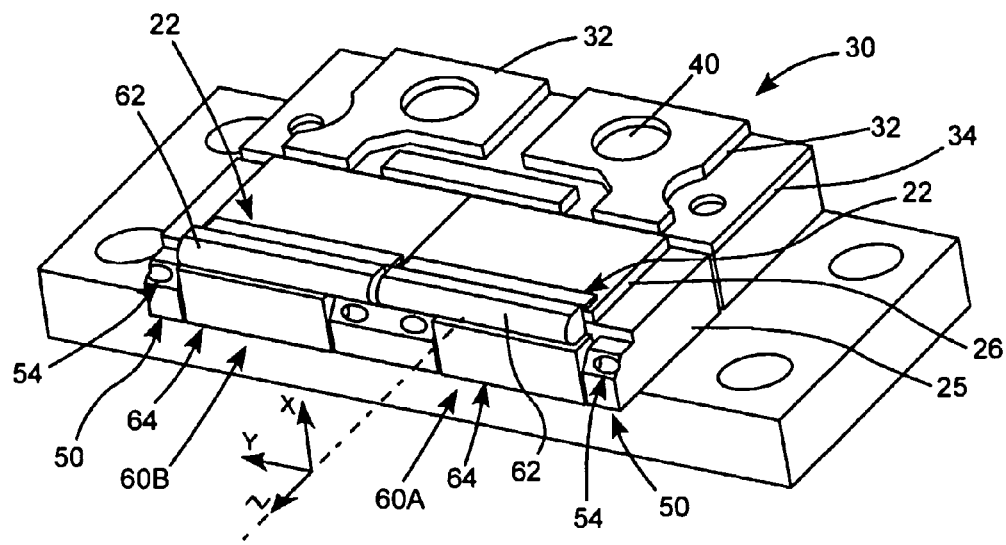
FIG. 4 is a three-dimensional view schematically illustrating the package of FIG. 3 in assembled form.
Figure 3A:
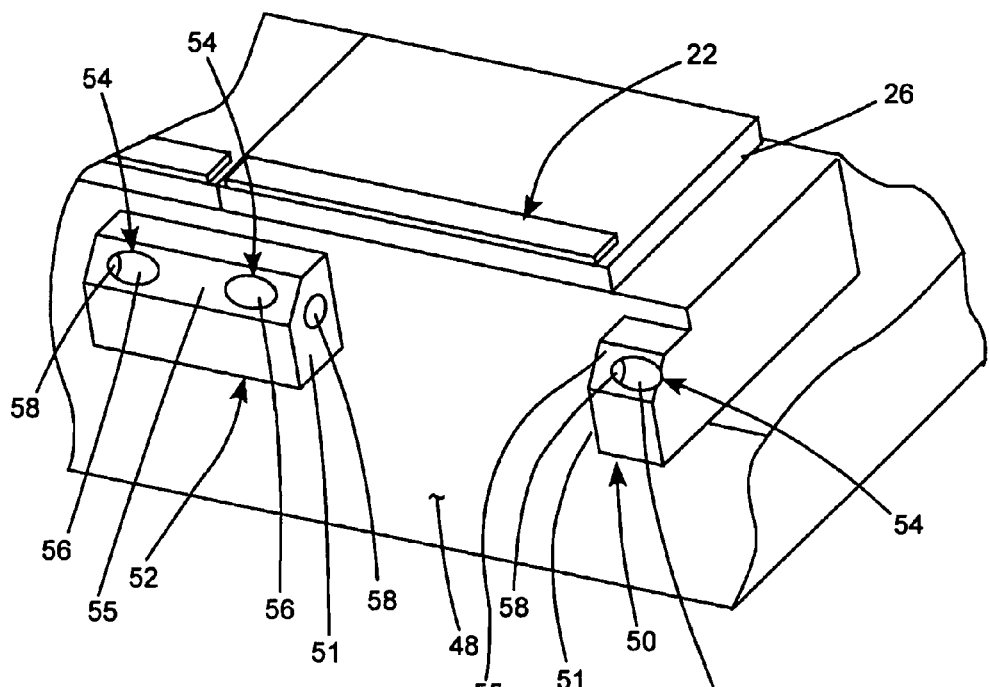
FIG. 3A is a fragmentary three-dimensional view schematically illustrating details of the bosses on the front face of the heat-sink of FIG. 3.
Figure 4A:
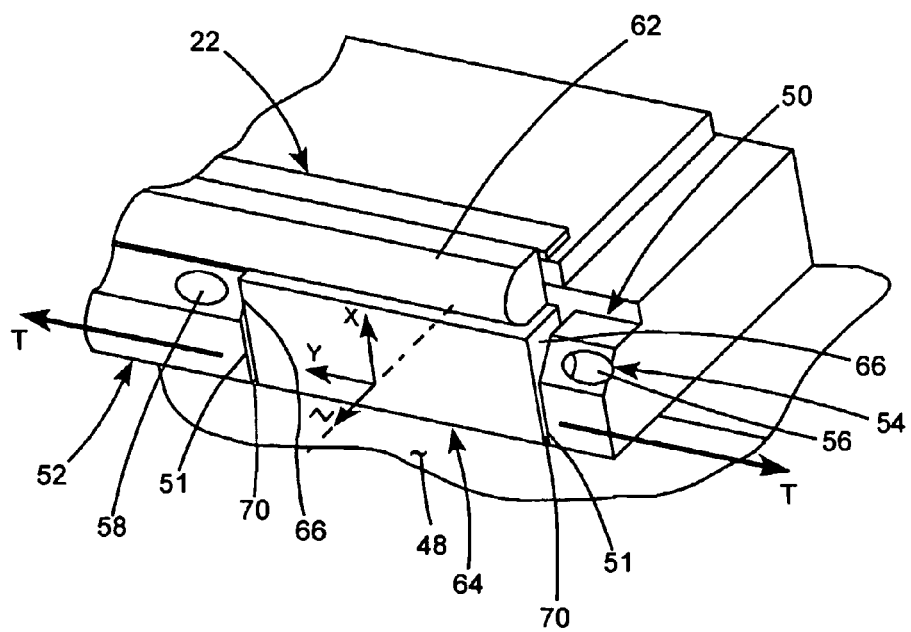
FIG. 4A is a fragmentary three-dimensional view schematically illustrating details of one of the cylindrical-lens assemblies mounted between two of the bosses on the front face of the heat-sink of FIG. 3.

FIG. 3, FIG. 3A, FIG. 4, and FIG. 4A schematically depict attachment of two cylindrical-lens assemblies 60 to package 20. Here, the lens assemblies, not being of symmetrical construction, are designated as a right-hand assembly 60A and a left-hand assembly 60B. FIG. 3 is an exploded view depicting assemblies 60A and 60B before attachment. FIG. 4 depicts the lens assemblies assembled into package 20. FIG. 3A is a fragmentary enlarged view of FIG. 3 providing an enlarged view of central boss 52 and the right-hand boss 50. FIG. 4A is a fragmentary enlarged view of FIG. 4 depicting lens assembly 60A between bosses 52 and 50.

Each lens assembly includes an elongated cylindrical lens 62 attached via an epoxy adhesive or the like to a rectangular mounting block 64. Preferably, mounting block 64 has a coefficient of expansion matched to that of the cylindrical lens, and, most preferably, the mounting block is made from the same material as that of the cylindrical lens. This, combined with the stiffness of mounting block 64 and the matching expansion coefficients of the lens and the block, provides that there is no bending moment on the lens in the fast-axis direction of the diode-laser during thermal cycling.

Mounting block 64 has lateral faces 66, here, perpendicular to the longitudinal axis of the lens, i.e., perpendicular the slow-axis of the diode-laser bar when the lens assembly is correctly mounted in the package. The length of the mounting block is preferably selected such that when the block is located between faces 51 of bosses 50 and 52, there can be a gap 70 between each boss-face 51 and the corresponding lateral face 66 of mounting block. Preferably the gap has a width less than about 0.01 inches. A particularly preferred gap width is about 0.005 inches.

A lens assembly 60 is mounted in package 20 by locating mounting block 64 thereof between faces 51 of a boss 52 and a boss 50. With diode-laser bar 22 operating to provide an alignment beam, the lens assembly is manipulated by suitable tooling (not shown) attached to the mounting block until the cylindrical lens is optimally aligned with the diode-laser bar, essentially parallel to the slow-axis of the diode-laser bar. Once the cylindrical lens is optimally aligned, the lens is held in position by the tooling, and a measured quantity of a UV and thermally curable epoxy is injected, via a hypodermic needle inserted into aperture 56 of a hole 54, through aperture 58 of the hole, into a gap 70. This procedure is then repeated for the other gap 70. The injected epoxy over the faces 51 and 66, and surface tension effects and viscosity of the liquid epoxy retain the epoxy in the gap between the faces. When the epoxy is cured (hardened) the tooling can be removed and the lens remains aligned. In a preferred curing method, liquid epoxy is initially UV cured, alignment (manipulation) tooling is removed, and the package is transferred to an oven to complete the epoxy curing thermally. A preferred UV and thermal curing epoxy is "Optocast 3410" manufactured by Electronic Materials Inc. (EMI) of Breckenridge, Colo.

Because of this inventive mounting arrangement for the lens assembly, the only significant forces acting on the lens assembly will be those due to any dimension change of the adhesive and those due to thermal coefficient of expansion mismatch between the metal of the bosses and the material of the mounting block of the lens assembly. These forces (free body forces) will be in opposition parallel to the slow-axis of the diode-laser bar as indicated in FIG. 4A by arrows T. Any net force will be directed along the slow-axis of the diode-laser bar and will not tend to misalign in the lens in the fast-axis direction of the diode-laser bar. The fast-axis direction is the critical alignment direction lens 52. Although the a copper heat-sink 24 and a glass mounting block 64 would have a large CTE mismatch (17 PPM/° C. and 9 PPM/° C., respectively) the opposing free-body forces depicted in FIG. 4A imply that, even with plastic deformation of the epoxy, the lens will only move in the non-critical (slow-axis) direction and the lens performance parameters will not be affected.

Figure 5:
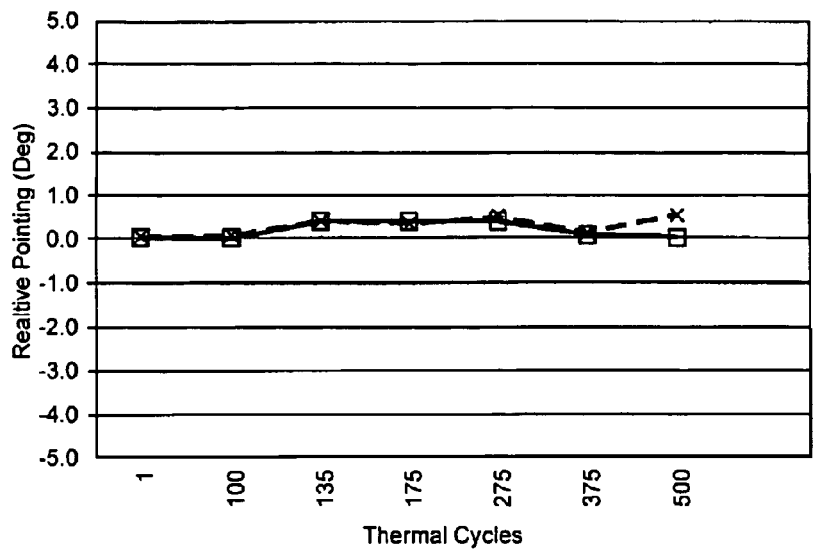
FIG. 5 is a graph schematically illustrating beam size and relative beam pointing for two examples of practical diode-laser packages in accordance with the embodiment of the present invention depicted in FIG. 4.

This implication is supported by results of thermal-cycling experiments performed on two different samples of diode-laser bar packages in accordance with the present invention. FIG. 5 graphically schematically illustrates measured relative beam-pointing for the two packages (dotted curve and solid curve) as a function of thermal cycling. Each of the thermal cycles was from −55° C. to +85° C. There was no significant change in pointing after as many as 500 such thermal cycles. The variation in each of the curves of FIG. 5 is within the measurement accuracy. Lenses attached by prior art methods will usually fail (become fatally misaligned) after no more than 50 such thermal cycles.

Figure 6:
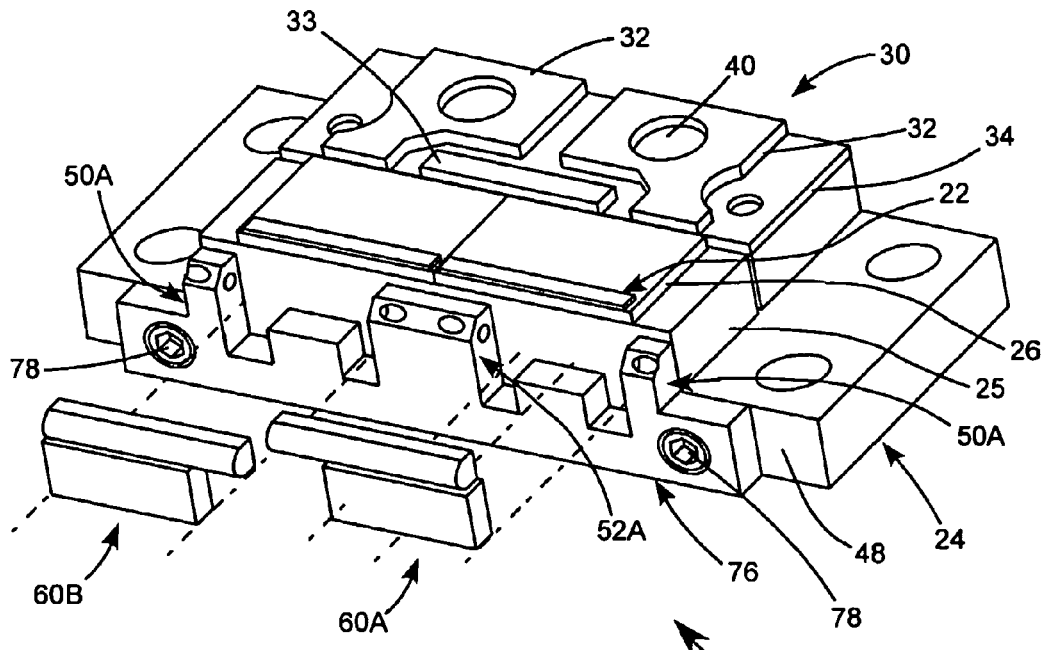
FIG. 6 is three-dimensional view schematically illustrating another embodiment of the present invention similar to the embodiment of FIGS. 1-4 but wherein the lens-assembly mounting-bosses are part of a separate unit attached to the heat-sink by screws.

FIG. 6 is an exploded three-dimensional view schematically illustrating another embodiment 20A of a diode-laser bar package in accordance with the present invention. Packer 20A is similar to above-described package 20 with an exception that heat-sink-integral lens-assembly-mounting bosses 50 and 52 of package 20 are replaced with similarly configured bosses 50A and 52A that are integrated into a separate unit 76. Unit 76 is attached to front face 48 of heat sink 24 by socket screws 78. Unit 78 may be made from the same material as the heat sink or from a different material having a thermal coefficient of expansion similar to that of the heat-sink. By way of example, a unit 78 made from titanium can be used with a heat-sink 24 made from copper. When unit 76 is attached to heat sink 24, lens assemblies 60A and 60B can be attached to the package as described above with reference to package 20 of FIGS. 1-4.

It should be noted that while the present invention has been described in the context of a diode-laser bar package including two diode-laser bars. The invention is equally applicable to a package including only one diode-laser bar or a package including three or more diode-laser bars. The invention is not limited to the embodiments described and depicted herein. Rather, the invention is limited only by the claims appended hereto.

What is claimed is:

1. Optical apparatus, comprising:
   a heat-sink;
   an elongated diode-laser bar having a slow-axis in the length direction of the diode-laser bar, a fast axis perpendicular to the slow-axis, and an emitting-axis perpendicular to the slow-axis and the fast axis, the diode-laser bar being in thermal communication with the heat-sink;
   first and second mounting bosses extending from a front face of the heat-sink, each thereof having a lateral face transverse to the slow axis of the diode-laser bar with the lateral faces spaced apart and facing each other in a direction parallel to the slow axis of the diode-laser bar;
   a lens assembly including an elongated cylindrical lens having an elongated mounting slab bonded thereto, the mounting slab having first and second lateral faces at each end thereof, the lens assembly being positioned so that the length of the cylindrical lens is aligned with the slow axis of the diode-laser bar and with the lateral faces of the mounting slab of the lens assembly attached by an adhesive to corresponding ones of the lateral faces of the mounting bosses; and
   wherein each of the mounting bosses has a hole extending therethrough from one face thereof to the lateral face thereof, wherein the length of the mounting slab of the lens assembly and the spacing between the lateral faces of the mounting bosses of the heat sink are selected such that there is a gap between each lateral face of the mounting slab and the corresponding lateral face of the mounting boss, and with the adhesive having been injected into the gaps via the corresponding holes in the mounting bosses.

2. The apparatus of claim 1, wherein the gap between each lateral face of the mounting slab and the corresponding lateral face of the mounting boss has a width less than about 0.01 inches.

3. The apparatus of claim 2, wherein the gap has a width of about 0.005 inches.

4. The apparatus of claim 1, wherein the adhesive is an epoxy.

5. The apparatus of claim 1, wherein the heat-sink is a copper heat-sink.

6. The apparatus of claim 1, wherein the cylindrical lens and the mounting slab have about the same thermal coefficient of expansion.

7. The apparatus of claim 6, wherein the cylindrical lens and the mounting slab are made from the same material.

8. The apparatus of claim 1, wherein the mounting bosses are an integral part of the heat-sink.

9. The apparatus of claim 1, wherein the mounting bosses are part of a separate unit attached to the front face of the heat sink.

10. The apparatus if claim 9, wherein the separate mounting boss unit and the heat-sink are made from different materials.

11. The apparatus of claim 1, wherein the diode-laser bar is bonded to a thermally conductive dielectric submount, the submount being bonded to the heat-sink.

12. Optical apparatus, comprising:
    a heat-sink;
    a plurality N of elongated diode-laser bars each thereof having a slow-axis in the length direction of the diode-laser bar, a fast axis perpendicular to the slow-axis, and an emitting-axis perpendicular to the slow-axis and the fast axis, each diode-laser bar being in thermal communication with the heat-sink, with the diode-laser bars arranged in line, adjacent each other, in the slow axis-direction;
    N+1 mounting bosses extending from a front face of the heat-sink, each thereof having at least one lateral face transverse to the slow axis of the diode-laser bars with the lateral faces spaced apart and facing each other in a direction parallel to the slow axis of the diode-laser bar;
    N lens assemblies, each thereof including an elongated cylindrical lens having an elongated mounting slab bonded thereto, each mounting slab having first and second lateral faces at each end thereof, the lens assemblies being positioned so that each of the cylindrical lenses are aligned with the slow axis of a corresponding one of the diode-laser bars, and with the lateral faces of the mounting slabs of the lens assemblies attached by an adhesive to corresponding ones of the lateral faces of the mounting bosses; and
    wherein each of the mounting bosses has at least one hole extending therethrough from one face thereof to the lateral face thereof, wherein the length of the mounting slab of each lens assembly and the spacing between the lateral faces of the mounting bosses of the heat sink are selected such that there is a gap between each lateral face of each of the mounting slabs and the corresponding lateral face of the mounting boss, and with the adhesive having been injected into the gaps via the corresponding holes in the mounting boss.

13. The apparatus of claim 12, wherein there are only first and second diode-laser bars, first and second lens assemblies and first, second and third mounting bosses, wherein the first and third mounting bosses have only one hole extending therethrough from the front thereof to the lateral face thereof, wherein the second mounting boss has first and second holes extending from the front thereof to respectively first and second opposite lateral faces thereof, and wherein the mounting slab of the first lens assembly is attached to the lateral face of the first mounting boss and the first lateral face of the second mounting boss and the mounting slab of the second lens assembly is attached to the second lateral face of the second mounting boss and the lateral face of the third mounting boss.

14. The apparatus of claim 12, wherein the mounting slab has a length less than that of the cylindrical lens.

15. A method of attaching an elongated cylindrical lens to a diode-laser bar package, the cylindrical lens having an optical axis, the diode-laser bar package including a heat-sink, the diode-laser bar having a slow-axis in the length direction of the diode-laser bar, a fast axis perpendicular to the slow-axis, and an emitting-axis perpendicular to the slow-axis and the fast axis, the diode-laser bar being in thermal communication with the heat sink, the method comprising:

providing first and second mounting bosses on a front face of the heat sink, each of the mounting bosses having a lateral face, the lateral faces of the mounting bosses being spaced apart and facing each other in the length direction of the diode-laser bar and each thereof having a hole extending therethrough from one face thereof to the lateral face thereof;

bonding the elongated cylindrical lens to an elongated mounting slab, the elongated mounting slab having opposite lateral faces;

positioning the lens assembly on the heat sink with the cylindrical lens thereof aligned with the diode-laser bar and with the lateral faces of the mounting slab facing corresponding ones of the lateral faces of the mounting bosses across a gap therebetween; and injecting a liquid adhesive via the holes in the mounting bosses into the gaps between the lateral faces of the mounting slab and the lateral faces of the mounting bosses.

16. A method as recited in claim 15, further including the step of actively curing the adhesive in the gaps to harden the adhesive and attach the lens assembly to the mounting bosses.

17. The method of claim 16, wherein the adhesive is an epoxy and the curing is initiated by ultraviolet curing and completed by thermal curing.

18. The method of claim 15, wherein each gap has a width less than 0.01 inches.

19. The method of claim 15, wherein each gap has a width of about 0.005 inches.

* * * * *